United States Patent
Knopp et al.

(10) Patent No.: US 6,768,757 B2
(45) Date of Patent: Jul. 27, 2004

(54) CAVITY MIRROR FOR OPTICALLY-PUMPED VERTICAL-CAVITY SURFACE-EMITTING LASER (VCSEL)

(75) Inventors: Kevin J. Knopp, Amesbury, MA (US); Peidong Wang, Billerica, MA (US); Daryoosh Vakhshoori, Cambridge, MA (US)

(73) Assignee: Nortel Networks, Ltd., St. Laurent (CA)

(*) Notice: Subject to any disclaimer, the term of this patent is extended or adjusted under 35 U.S.C. 154(b) by 0 days.

(21) Appl. No.: 10/112,159

(22) Filed: Mar. 29, 2002

(65) Prior Publication Data

US 2003/0185261 A1 Oct. 2, 2003

(51) Int. Cl.[7] .................................................. H01S 5/00
(52) U.S. Cl. ............................ 372/43; 372/44; 372/45; 372/46; 372/47; 372/48; 372/49; 372/50; 372/99; 372/103; 359/584; 359/586; 359/588
(58) Field of Search ............................... 372/43–50, 99, 372/103; 359/584, 586, 588

(56) References Cited

U.S. PATENT DOCUMENTS

| | | | | |
|---|---|---|---|---|
| 5,753,941 A | * | 5/1998 | Shin et al. ..................... 257/98 |
| 6,154,318 A | * | 11/2000 | Austin et al. ................ 359/584 |
| 6,404,797 B1 | * | 6/2002 | Mooradian .................... 372/96 |
| 6,438,149 B1 | * | 8/2002 | Tayebati et al. .............. 372/45 |
| 6,584,126 B2 | * | 6/2003 | Wang et al. ................... 372/20 |
| 6,611,544 B1 | * | 8/2003 | Jiang et al. .................... 372/50 |
| 6,645,784 B2 | * | 11/2003 | Tayebati et al. .............. 438/46 |

OTHER PUBLICATIONS

Kevin J. Knopp et al., Vertical–Cavity Surface–Emitting Lasers With Low–Ripple Optical Pumping Windows, IEEE Journal of Selected Topics In Quantum Electronics, vol. 3, No. 2, Apr. 1997, pp. 366–371.

* cited by examiner

Primary Examiner—Don Wong
Assistant Examiner—Delma R. Flores-Ruiz
(74) Attorney, Agent, or Firm—John C. Gorecki

(57) ABSTRACT

A laser comprising: a front mirror and a rear mirror which are disposed so as to establish a reflective cavity therebetween; a gain region disposed between the front mirror and the rear mirror, the gain region being constructed so that when the gain region is appropriately stimulated by light from a pump laser, the gain region will emit light; and one of the front mirror and the rear mirror being positioned to admit pump light into the reflective cavity, the one of the front mirror and the rear mirror having a low and substantially constant reflectance over a pumping wavelength range and having a high and substantially constant reflectance over a lasing wavelength range.

17 Claims, 3 Drawing Sheets

CAVITY MIRROR FOR OPTICALLY-PUMPED VERTICAL-CAVITY SURFACE-EMITTING LASER (VCSEL)

FIELD OF THE INVENTION

This invention relates to photonic devices in general, and more particularly to lasers.

BACKGROUND OF THE INVENTION

Lasers are well known in the art. A laser typically comprises a front mirror and a rear mirror which are disposed so as to establish a reflective cavity therebetween. An active, or gain, region is disposed between the front mirror and the rear mirror. The gain region is constructed so that when the gain region is appropriately stimulated, it will emit light. The rear mirror is typically substantially fully reflective at the lasing wavelength, and the front mirror is typically partially reflective at the lasing wavelength so as to allow a beam of laser light to be emitted therefrom.

As is well known in the art, the gain region may be stimulated by electrical current ("electrically pumped") or it may be stimulated by light ("optically pumped").

The present invention is directed to optically pumped lasers and, more particularly, to an improved optically pumped laser having a substantially constant power output.

SUMMARY OF THE INVENTION

The present invention comprises an improved optically pumped laser having increased efficiency.

In one form of the invention, there is provided a laser comprising: a front mirror and a rear mirror which are disposed so as to establish a reflective cavity therebetween; a gain region disposed between the front mirror and the rear mirror, the gain region being constructed so that when the gain region is appropriately stimulated by light from a pump laser, the gain region will emit light; and one of the front mirror and the rear mirror being positioned to admit pump light into the reflective cavity, the one of the front mirror and the rear mirror having a low and substantially constant reflectance over a pumping wavelength range and having a high and substantially constant reflectance over a lasing wavelength range.

In another form of the invention, there is provided a method of lasing, the method comprising: providing a laser comprising: a front mirror and a rear mirror which are disposed so as to establish a reflective cavity therebetween; a gain region disposed between the front mirror and the rear mirror, the gain region being constructed so that when the gain region is appropriately stimulated by light from a pump laser, the gain region will emit light; one of the front mirror and the rear mirror being positioned to admit pump light into the reflective cavity, the one of the front mirror and the rear mirror having a low and substantially constant reflectance over a pumping wavelength range and having a high and substantially constant reflectance over a lasing wavelength range; and providing pump light to the one of the front mirror and the rear mirror being positioned to admit pump light into the reflective cavity.

In still another form of the invention, there is provided a method of constructing a mirror for an optically pumped laser, the method comprising: selecting a reflectance profile for the mirror; querying a database to generate a mirror configuration comprising materials, thicknesses and number of mirror pairs so as to construct the mirror having the reflectance profile; and constructing the mirror based on the mirror configuration.

BRIEF DESCRIPTION OF THE DRAWINGS

These and other features of the present invention will be more fully disclosed by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
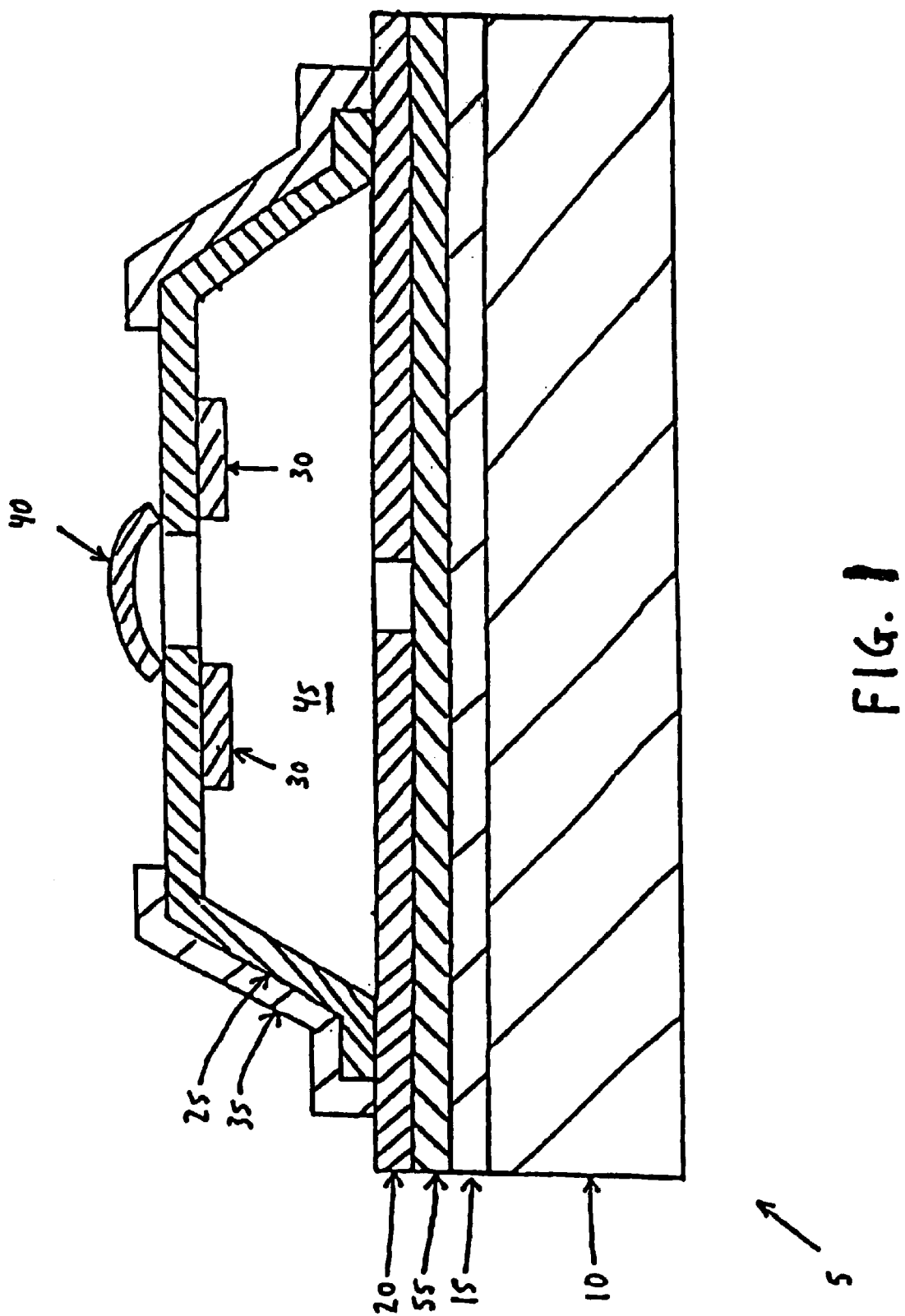
FIG. 1 is a schematic side sectional view of a tunable VCSEL formed in accordance with the present invention.

Looking first at FIG. 1, there is shown a schematic diagram of a novel laser 5 formed in accordance with the present invention. Optically pumped laser 5 is a tunable vertical-cavity surface-emitting laser (VCSEL) of the sort disclosed in pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER (Attorney's Docket No. CORE-33), and in pending prior U.S. patent application Ser. No. 09/543,318, filed Apr. 5, 2000 by Peidong Wang et al. for SINGLE MODE OPERATION OF MICROELECTROMECHANICALLY TUNABLE, HALF-SYMMETRIC, VERTICAL CAVITY SURFACE EMITTING LASERS (Attorney's Docket No. CORE-53), and in pending prior U.S. patent application Ser. No. 09/750,434, filed Dec. 28, 2000 by Peidong Wang et al. for TUNABLE FABRY-PEROT FILTER AND TUNABLE VERTICAL CAVITY SURFACE EMITTING LASER (Attorney's Docket No. CORE-67). The three aforementioned patent applications are hereby incorporated herein by reference.

More particularly, and looking now at FIG. 1, there is shown a tunable VCSEL 5. VCSEL 5 generally comprises a substrate 10, a bottom mirror 15 mounted to the top of substrate 10, a bottom electrode 20 mounted to the top of bottom mirror 15, a thin membrane support 25 atop bottom electrode 20, a top electrode 30 fixed to the underside of thin membrane support 25, a reinforcer 35 fixed to the outside perimeter of thin membrane support 25, and a confocal top mirror 40 set atop thin membrane support 25, with an air cavity 45 being formed between bottom mirror 15 and top mirror 40.

As a result of this construction, a Fabry-Perot cavity is effectively created between top mirror 40 and bottom mirror 15. Furthermore, by applying an appropriate voltage across top electrode 30 and bottom electrode 20, the position of top mirror 40 can be changed relative to bottom mirror 15, whereby to change the length of the lasing Fabry-Perot cavity.

A gain region (or "active region") 55 is positioned between bottom mirror 15 and bottom electrode 20. As a result, when gain region 55 is appropriately stimulated, e.g., by optical pumping, lasing can be established between top mirror 40 and bottom mirror 15. Furthermore, by applying an appropriate voltage across top electrode 30 and bottom electrode 20, the position of top mirror 40 can be changed relative to bottom mirror 15, whereby to change the length of the laser's resonant cavity, and hence tune VCSEL 5.

In accordance with the present invention, one of the mirrors, specifically the one positioned to admit pump light into the air cavity, has a very low reflectance over a pumping wavelength range and a very high reflectance over a lasing wavelength range. In addition, this mirror is configured such that the reflectance over the pumping wavelength range and the lasing wavelength range are each substantially constant or flat.

Figure 2:
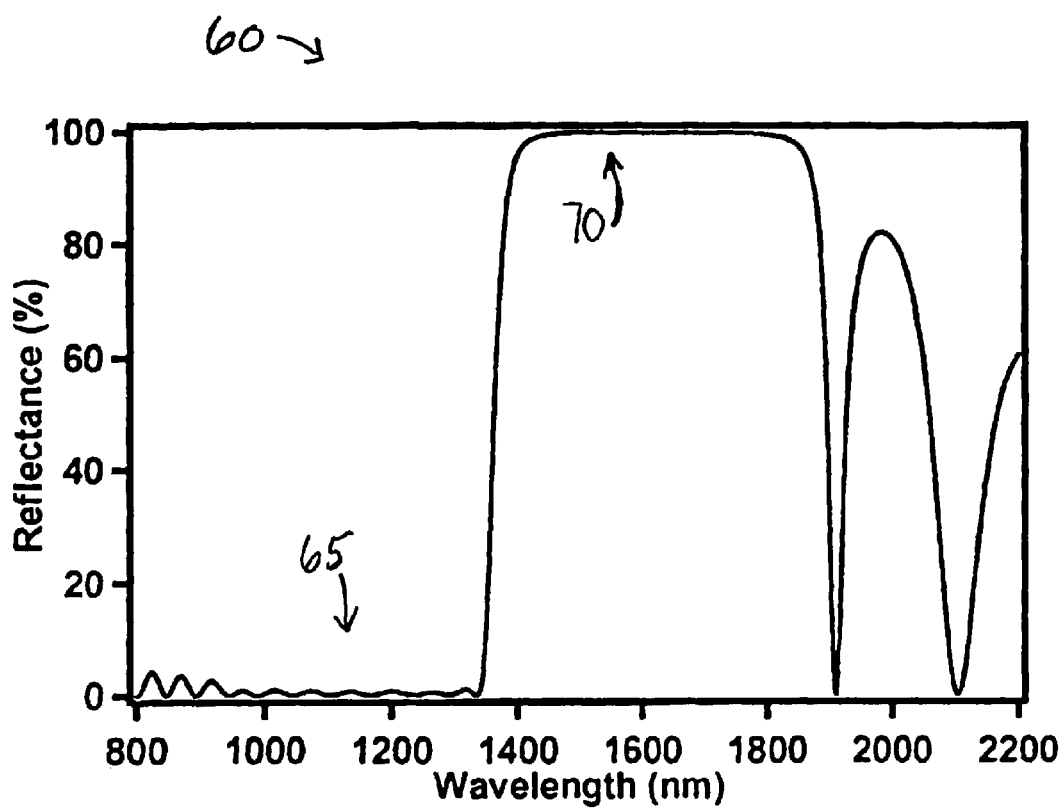
FIG. 2 is a graph of a first reflectivity curve for a preferred embodiment of the present invention in which the novel mirror is configured for low and constant reflectance of pumping wavelengths of light over a broad pumping wavelength.

Now looking at FIG. 2, in a preferred embodiment of the present invention, there is shown a first reflectivity curve 60 corresponding to one preferred embodiment of top mirror 40 (see FIG. 1). Top mirror 40 is configured to provide a low and substantially constant reflectance over a pumping wavelength range 65. Top mirror 40 is also configured to provide a high and substantially constant reflectance over a lasing wavelength range 70. Preferably, top mirror 40 is constructed to provide substantially no reflectance to light within pumping wavelength range 65 and a reflectance of about 99.9% to light within lasing wavelength range 70.

Figure 3:
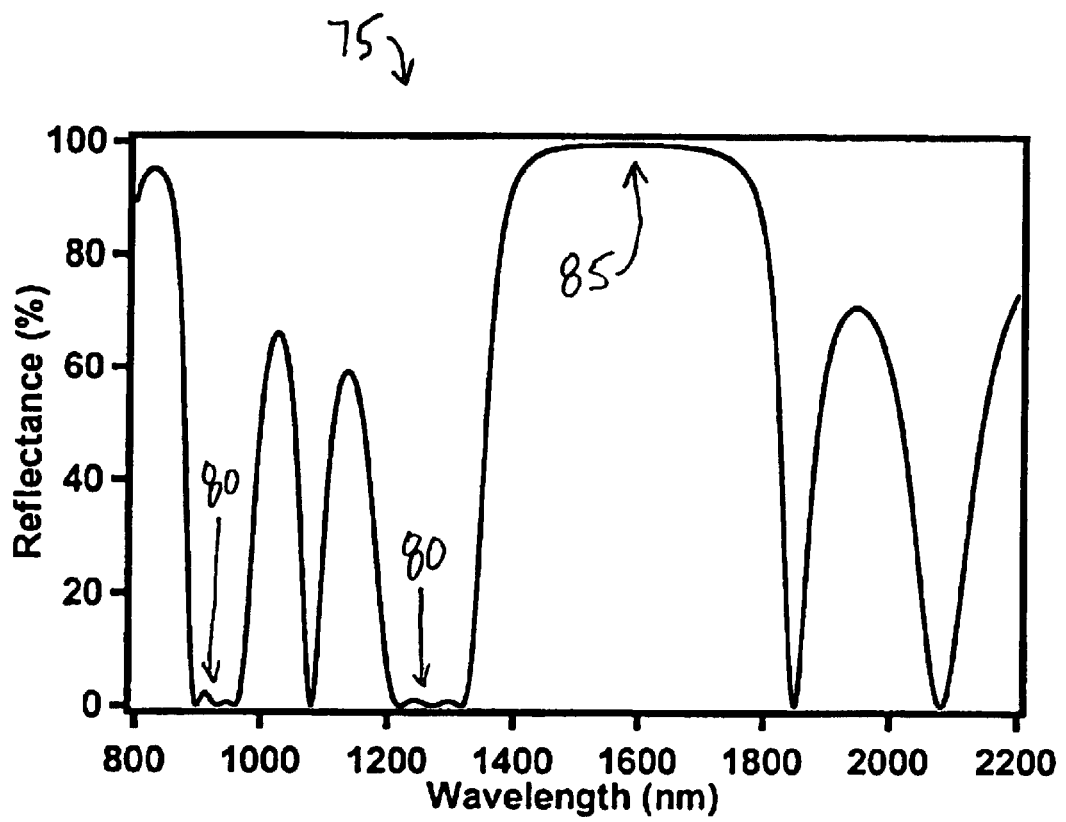
FIG. 3 is a graph of a second reflectivity curve for another preferred embodiment of the present invention in which the novel mirror is configured for high and constant reflectance of lasing wavelengths of light in two windows of pumping wavelength ranges.

Now looking at FIG. 3, in another preferred embodiment of the present invention, there is shown a second reflectivity curve 75 corresponding to another preferred embodiment of top mirror 40 (see FIG. 1). Top mirror 40 is configured to provide two ranges, or "windows" 80, of low and substantially constant reflectance over two portions of pump wavelength ranges. Top mirror 40 is also configured to provide a high and substantially constant reflectance over a lasing wavelength range 85.

In a preferred embodiment of the invention, top mirror 40 (see FIG. 1) is a distributed Bragg reflector formed out of mirror pairs. Preferably, the material and thickness of each layer of the mirror pair is selected to produce the desired reflectance profiles, such as curve 60 (see FIG. 2) and curve 70 (see FIG. 3), around a pumping wavelength, range, such as pumping wavelength range 65 (see FIG. 2) or pumping wavelength range 80 (see FIG. 3), and a lasing wavelength range, such as lasing wavelength range 70 (see FIG. 2) or lasing wavelength range 80 (see FIG. 3). A computer program may be used for generating possible configurations of mirror materials and layers. These configurations may then be analyzed to discard ones that are impossible to create. As an example of one preferred embodiment of the present invention, and referring to the reflectance profile of curve 60 (See FIG. 2), a pumping region of about 950 nm to about 1340 nm is created at pumping wavelength range 65 with a transmission rate of greater than about 99%, while a lasing region of about 1528 nm to about 1560 nm has a reflectance of greater than about 99.9% at lasing wavelength range 70.

Looking now at FIGS. 1 and 2, a method is disclosed for constructing top mirror 40 (see FIG. 1) with a tailored reflectance profile, such as curve 60 (see FIG. 2) or curve 75 (see FIG. 3). In addition, a method is disclosed for lasing with a VCSEL 5 having a top mirror 40 with a tailored reflectance profile, such as curve 60 (see FIG. 2) or curve 75 (FIG. 3).

A tailored reflectance profile, such as that of curve 60 (see FIG. 2) or curve 75 (see FIG. 3), can be achieved by selecting and configuring mirror materials and layer thicknesses for low and substantially constant reflectance over pumping wavelength range 70. These mirror materials may be selected and configured from either dielectric or semiconductor materials.

It is desirable to provide a tailored reflectance to top mirror 40 to create a wideband window of low and substantially constant reflectance profile within the typical interference fringe spectrum of a distributed Bragg reflector. This wideband window of pumping wavelength range 65 provides improved stability in the coupling of tunable VCSEL 5 to an optical pump source, which counteracts several common effects of an irregular reflectance profile and provides low sensitivity to manufacturing variations.

A first common effect of an irregular reflectance profile includes imprecise tuning of pump light due to a varying reflectivity profile over a pumping wavelength range. Such a varying reflectivity profile produces, in turn, varying amounts of coupling of reflectivity and changes to the power output of a tunable VCSEL.

A second common effect of an irregular reflectance profile is "device to device" variation. This occurs when one tunable VCSEL has a differing reflectivity profile over its wavelength range than that of another tunable VCSEL. These differing profiles cause, in turn, variations in the power output profile from one VCSEL to another tunable VCSEL.

A third common effect of an irregular reflectance profile is reduced power output due to heating, which causes a shift in the reflectivity profile of the pumping wavelength range due to changes in the optical index of the tunable VCSEL.

A fourth common effect of an irregular reflectance profile is reduced power output due to heating noise, which causes a shift in the cavity wavelength and affects coupling of reflected light therein. Heating noise comprises physical motion induced by heating of thin membrane support 25.

These four effects reduce the effectiveness of tunable VCSEL 5 as the level of output power varies due to changes in the reflectivity profile as the pumping wavelength of the optical pump remains constant. The present invention provides a substantially constant portion of reflectivity curve 60 over the pumping wavelength range 65 (see FIG. 2) or substantially constant portions of reflectivity curve 75 over windows 80 in of the pumping wavelength range. These substantially constant portions eliminate variations in reflectivity over desired wideband sections of pumping wavelength ranges and, in turn, permit VCSEL 5 to provide a substantially constant power output.

It is to be understood that the present invention is by no means limited to the particular constructions and method steps disclosed above and/or shown in the drawings, but also comprises any modifications or equivalents within the scope of the claims.

What is claimed is:

1. A laser comprising:
    a front mirror and a rear mirror which are disposed so as to establish a reflective cavity therebetween;
    a gain region disposed between said front mirror and said rear mirror, said gain region being constructed so that when said gain region is appropriately stimulated by light from a pump laser, said gain region will emit light; and
    one of said front mirror and said rear mirror being positioned to admit pump light into said reflective cavity, said one of said front mirror and said rear mirror having a low and substantially constant reflectance over a pumping wavelength range and having a high and substantially constant reflectance over a lasing wavelength range.

2. A method of lasing, said method comprising:
providing a laser comprising:
a front mirror and a rear mirror which are disposed so as to establish a reflective cavity therebetween;
a gain region disposed between said front mirror and said rear mirror, said gain region being constructed so that when said gain region is appropriately stimulated by light from a pump laser, said gain region will emit light; and
one of said front mirror and said rear mirror being positioned to admit pump light into said reflective cavity, said one of said front mirror and said rear mirror having a low and substantially constant reflectance over a pumping wavelength range and having a high and substantially constant reflectance over a lasing wavelength range; and
providing pump light to said one of said front mirror and said rear mirror that is positioned to admit pump light into said reflective cavity.

3. A method of constructing a mirror for an optically pumped laser, said method comprising:
selecting a reflectance profile for said mirror, said reflectance profile providing for a low and substantially constant reflectance over a pumping wavelength range and a high and substantially constant reflectance over a lasing wavelength range;
querying a database to generate a mirror configuration comprising materials, thicknesses and number of mirror pairs so as to construct said mirror having said reflectance profile; and
constructing said mirror based on said mirror configuration.

4. The laser of claim 1, further comprising a substrate, and wherein the rear mirror is mounted on the substrate.

5. The laser of claim 4, further comprising a thin support structure disposed above the substrate and configured a support the front mirror.

6. The laser of claim 5, further comprising a first and a second electrode configured to cause movement of at least one of the front and rear mirrors relative to the other of the front and rear mirrors.

7. The laser of claim 5, wherein the front mirror is a confocal top mirror that is set atop the thin support member.

8. The laser of claim 1, wherein the cavity is a Fabry-Perot cavity.

9. The laser of claim 8, wherein the gain region does not fill the entire Fabry-Perot cavity.

10. The laser of claim 1, wherein the front mirror is configured to have the low and substantially constant reflectance over the pumping wavelength range and the high and substantially constant reflectance over the lasing wavelength range.

11. The laser of claim 10, wherein the front mirror has a substantially no reflectance to light within the pumping wavelength range and a reflectance of about 99.9% to light within the lasing wave length range.

12. The laser of claim 1, wherein the pumping wavelength range is in a region between about 800 nanometers (nm) and about 1350 nm, and the lasing wavelength range is in a region between about 1400 nm and about 1900 nm.

13. The laser of claim 12, wherein the pumping wavelength range is a region of about 950 nanometers (nm) to about 1340 nm, and the lasing wavelength range is a region of about 1528 nm to about 1560 nm.

14. The laser of claim 10, wherein the pumping wavelength range has a plurality of windows of low and substantially constant reflectance.

15. The laser of claim 14, wherein one of the windows of low and substantially constant reflectance is adjacent e lasing wavelength range.

16. The laser of claim 14, wherein a first of the windows is in a region between about 900 nanometers (nm) and about 1000 nm, a second of the windows is in a region between about 1200 nm and about 1300 nm, and the lasing wavelength range is in a region between about 1400 nm and about 1900 nm.

17. The laser of claim 1, wherein the one of the front mirror and the rear mirror that is positioned to admit pump light into the reflective cavity comprises a distributed Bragg reflector formed out of mirror pairs.

* * * * *